United States Patent
Lin

(10) Patent No.: US 12,217,812 B2
(45) Date of Patent: Feb. 4, 2025

(54) DATA INPUT VERIFICATION METHOD AND DATA INPUT VERIFICATION STRUCTURE

(71) Applicant: CHANGXIN MEMORY TECHNOLOGIES, INC., Hefei (CN)

(72) Inventor: Feng Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 9 days.

(21) Appl. No.: 18/363,874

(22) Filed: Aug. 2, 2023

(65) Prior Publication Data

US 2024/0006009 A1 Jan. 4, 2024

Related U.S. Application Data

(63) Continuation of application No. PCT/CN2022/123924, filed on Oct. 8, 2022.

(30) Foreign Application Priority Data

Jun. 29, 2022 (CN) .......................... 202210761364.6

(51) Int. Cl.
*G11C 29/00* (2006.01)
*G11C 29/36* (2006.01)

(52) U.S. Cl.
CPC .................. *G11C 29/36* (2013.01)

(58) Field of Classification Search
CPC ..................................... G11C 29/36
See application file for complete search history.

(56) References Cited

U.S. PATENT DOCUMENTS

| 4,481,628 A | 11/1984 | Pasquinelli |
| 6,252,903 B1 | 6/2001 | Werner et al. |

(Continued)

FOREIGN PATENT DOCUMENTS

| CN | 102055314 A | 5/2011 |
| CN | 103926471 A | 7/2014 |

(Continued)

OTHER PUBLICATIONS

International Search Report cited in PCT/CN2022/123924 mailed Nov. 25, 2022, 11 pages.

(Continued)

*Primary Examiner* — Esaw T Abraham
(74) *Attorney, Agent, or Firm* — Syncoda LLC; Feng Ma

(57) ABSTRACT

A data input verification method and a data input verification structure are provided in the present disclosure. The data input verification method includes: generating a randomly combined input character string; generating a test input signal inputted to a receiver of a memory based on the input character string and a simulated inter-symbol interference value, where the simulated inter-symbol interference value is an estimated value of inter-symbol interference transmitted from an output end of a memory controller to the receiver; inputting the test input signal into the receiver and obtaining an output signal of the receiver; determining whether a string represented by the output signal is equal to the input string and generating an eye diagram of the output signal.

14 Claims, 4 Drawing Sheets

(56) References Cited

U.S. PATENT DOCUMENTS

| | | | |
|---|---|---|---|
| 7,013,257 B1* | 3/2006 | Nolan | H04B 17/0087 379/27.04 |
| 7,069,663 B1* | 3/2006 | Nolan | H04B 25/0087 |
| 7,463,680 B2* | 12/2008 | Buckwalter | H04L 1/205 375/233 |
| 8,614,940 B1* | 12/2013 | Dybdal | H04J 11/0066 370/542 |
| 8,694,837 B1* | 4/2014 | Qian | H04L 25/03019 714/704 |
| 9,014,254 B2* | 4/2015 | Atwood | H04L 25/03057 375/232 |
| 9,148,315 B1* | 9/2015 | Qian | H04L 25/03019 |
| 10,069,663 B1* | 9/2018 | Poon | H04L 25/0278 |
| 10,091,188 B2* | 10/2018 | Xiao | G06F 21/31 |
| 10,491,430 B2* | 11/2019 | Sreeramaneni | H04L 25/03057 |
| 2002/0048333 A1 | 4/2002 | Ahmed et al. | |
| 2005/0069031 A1 | 3/2005 | Sunter et al. | |
| 2007/0223571 A1* | 9/2007 | Viss | H04L 25/03057 375/233 |
| 2014/0058699 A1* | 2/2014 | Okamoto | G01R 31/2851 702/118 |
| 2019/0215195 A1 | 7/2019 | Hormati et al. | |
| 2021/0288740 A1 | 9/2021 | Shokrollahi et al. | |
| 2022/0150094 A1 | 5/2022 | Nangare | |

FOREIGN PATENT DOCUMENTS

| | | |
|---|---|---|
| CN | 114371761 A | 4/2022 |
| CN | 114611542 A | 6/2022 |
| TW | 437215 B | 5/2001 |

OTHER PUBLICATIONS

TW Office Action cited in TW111140918, mailed Aug. 11, 2023, 12 pages.

* cited by examiner

DATA INPUT VERIFICATION METHOD AND DATA INPUT VERIFICATION STRUCTURE

CROSS-REFERENCE TO RELATED APPLICATIONS

This is a continuation of International Patent Application No. PCT/CN2022/123924, filed on Oct. 8, 2022, which claims the priority to Chinese Patent Application No. 202210761364.6, titled "DATA INPUT VERIFICATION METHOD AND DATA INPUT VERIFICATION STRUCTURE" and filed on Jun. 29, 2022. The disclosures of International Patent Application No. PCT/CN2022/123924 and Chinese Patent Application No. 202210761364.6 are incorporated herein by reference in their entireties.

TECHNICAL FIELD

The present disclosure relates to, but is not limited to, a data input verification method and a data input verification structure.

BACKGROUND

The time-domain response of the channel of a memory exhibits a tailing phenomenon, which affects the input/output of next symbol data. This is commonly known as Inter-Symbol Interference (ISI). In addition, in practical application scenarios, the time-domain response of the channel also exhibits phenomena such as crosstalk and reflection in non-ideal situations, which further increase the error in the time-domain response of the channel.

How to test the receiver performance of a memory to avoid interference from time-domain response errors on the input data of the memory is an urgent technical problem that needs to be solved.

SUMMARY

An overview of the subject described in detail in the present disclosure is provided below, which is not intended to limit the protection scope of the claims.

The present disclosure provides a data input verification method and a data input verification structure.

According to a first aspect, the present disclosure provides a data input verification method, including: generating a randomly combined input character string; generating a test input signal inputted to a receiver of a memory based on the input character string and a simulated inter-symbol interference value, where the simulated inter-symbol interference value is an estimated value of inter-symbol interference transmitted from an output end of a memory controller to the receiver; in generated test input signal, a consecutive non-initial character "1" corresponds to a preset positive swing amplitude, a non-consecutive character "1" corresponds to an interference positive swing amplitude, a consecutive non-initial character "0" corresponds to a preset negative swing amplitude, a non-consecutive character "0" corresponds to an interference negative swing amplitude, a value of the preset positive swing amplitude is greater than a value of the interference positive swing amplitude, and a value of the preset negative swing amplitude is less than a value of the interference negative swing amplitude; inputting the test input signal into the receiver and obtaining an output signal of the receiver; determining whether a string represented by the output signal is equal to the input string and generating an eye diagram of the output signal.

According to a second aspect, the present disclosure provides a data input verification structure, which performs input verification by using the data input verification method provided in the first aspect. The data input verification structure includes: a data generating module, configured to generate a randomly combined input character string, and generate a test input signal inputted to a receiver of a memory based on the input character string and a simulated inter-symbol interference value, wherein the simulated inter-symbol interference value is an estimated value of inter-symbol interference transmitted from an output end of a memory controller to the receiver; the receiver, configured to receive the test input signal and generate an output signal according to the test input signal; and a determining module, connected to the data generating module and receiving the output signal, and configured to determine whether a character string represented by the output signal is equal to the input character string and generate an eye diagram of the output signal.

Other aspects of the present disclosure are understandable upon reading and understanding the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely referring to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

As mentioned in the background, the time-domain response of the channel of a memory exhibits a tailing phenomenon, which affects the input/output of next symbol data. This is commonly known as Inter-Symbol Interference (ISI). In addition, in practical application scenarios, the time-domain response of the channel also exhibits phenomena such as crosstalk and reflection in non-ideal situations, which further increase the error in the time-domain response of the channel.

Figure 1:
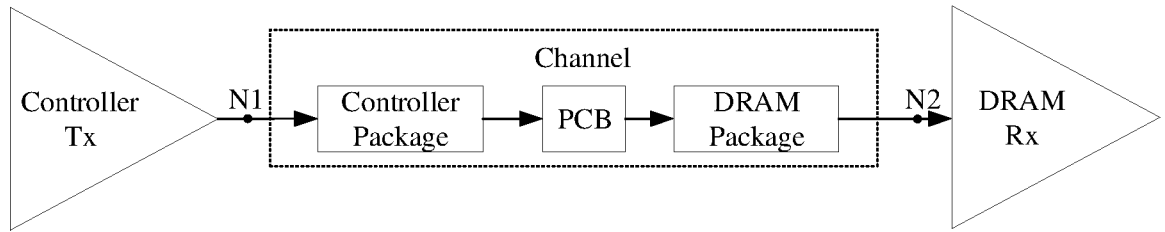
FIG. 1 is a schematic structural diagram of a data receiving structure of a memory according to an embodiment of the present disclosure.

Referring to FIG. 1, data outputted by a transmitter Controller Tx of a memory controller is transmitted to a receiver DRAM Rx of a memory through a data transmission channel Channel, thereby realizing the data input to the memory. The data transmission channel Channel includes: a first packaging structure Controller Package corresponding to the memory controller, a second packaging structure DRAM Package corresponding to the memory, and a printed circuit board PCB connecting the memory controller and the memory.

Figure 2:
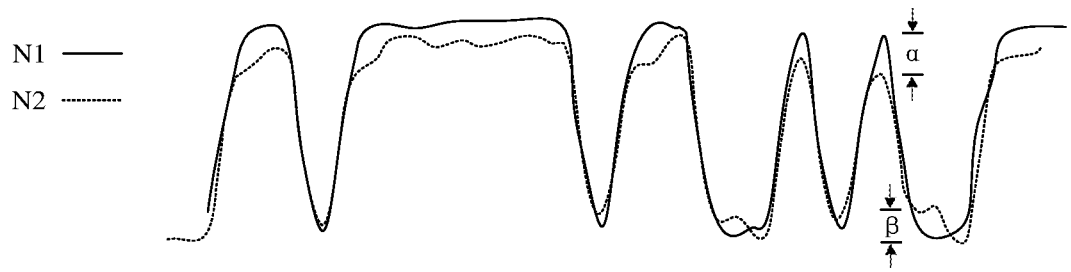
FIG. 2 is a schematic diagram of the principle of inter-symbol interference during data receiving of a memory according to an embodiment of the present disclosure.

It is assumed that initial input data outputted by the transmitter Controller Tx of the memory controller is N1. The initial input data N1 is subjected to the interference of a time-domain response error during the transmission process in the data transmission channel Channel and becomes input data N2 inputted to the receiver of the memory. As shown in FIG. 2, compared with the initial input data N1, in the input data N2, the non-consecutive character "1" corresponds to a swing amplitude decrease $\alpha$, and the non-consecutive character "0" corresponds to a swing amplitude increase $\beta$.

In some cases, if the parameters $\alpha$ and $\beta$ are relatively large, it may cause the characters inputted to the receiver to be incorrectly recognized by the receiver, resulting in the memory executing incorrect commands or storing incorrect data. Therefore, how to test the receiver performance of a memory to avoid interference from time-domain response errors on the input data of the memory is an urgent technical problem that needs to be solved.

An embodiment of the present disclosure provides a data input verification method to test the performance of the receiver at a lower cost, thereby avoiding the effect of time-domain response errors on the data input to the memory.

Figure 3:
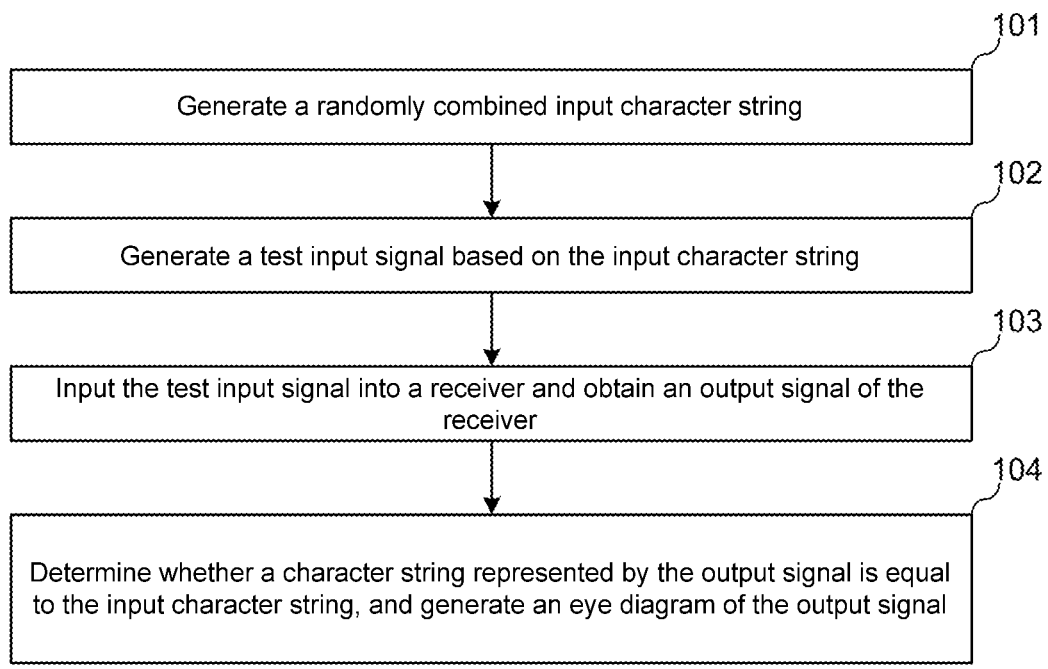
FIG. 3 is a schematic flowchart corresponding to steps of a first data input verification method according to an embodiment of the present disclosure.
Figure 4:
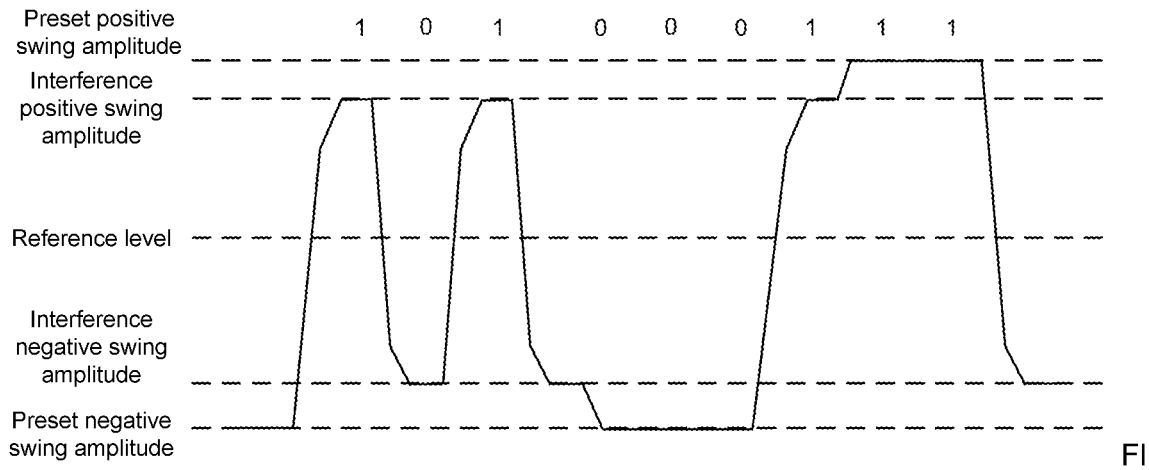
FIG. 4 is a schematic diagram of an amplitude value of an input signal generated based on the first data input verification method according to an embodiment of the present disclosure.
Figure 5:
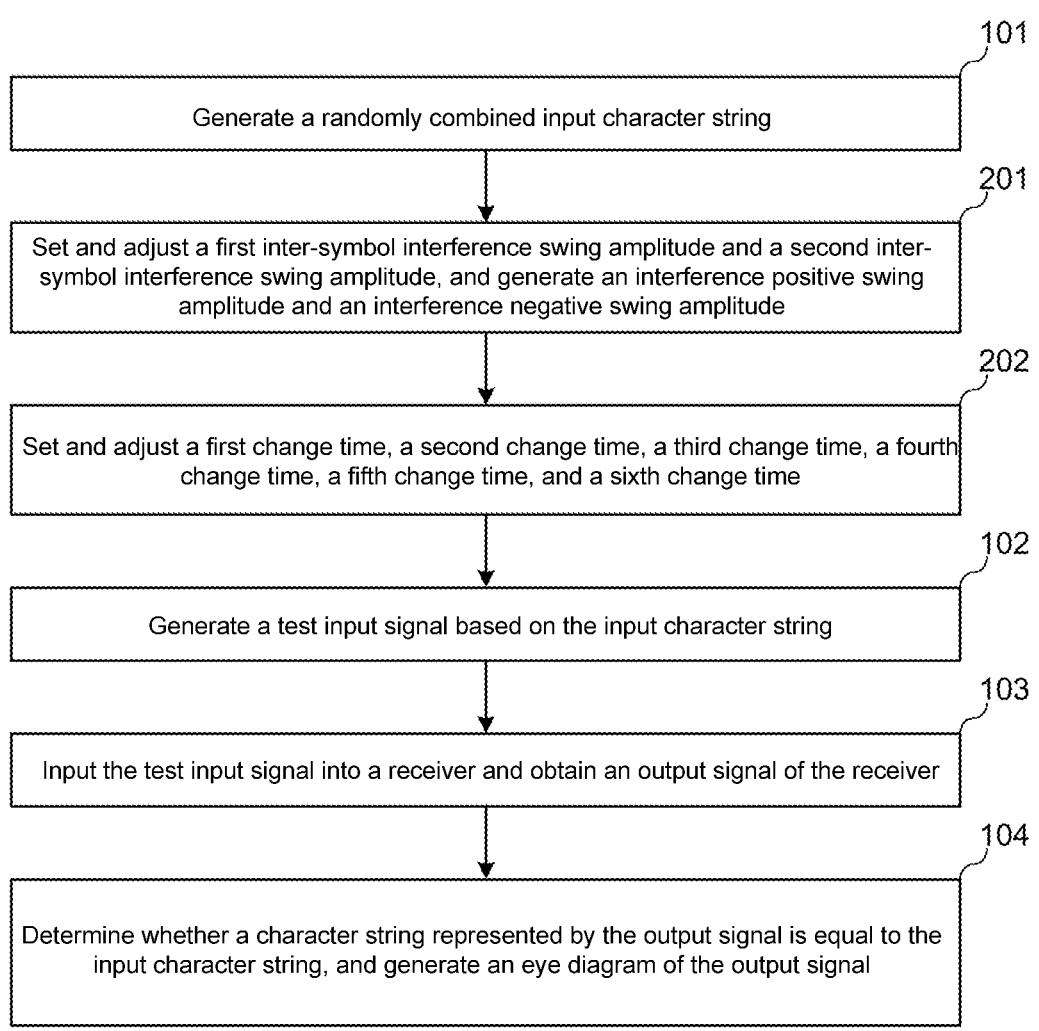
FIG. 5 is a schematic flowchart corresponding to steps of a second data input verification method according to an embodiment of the present disclosure.
Figure 6:
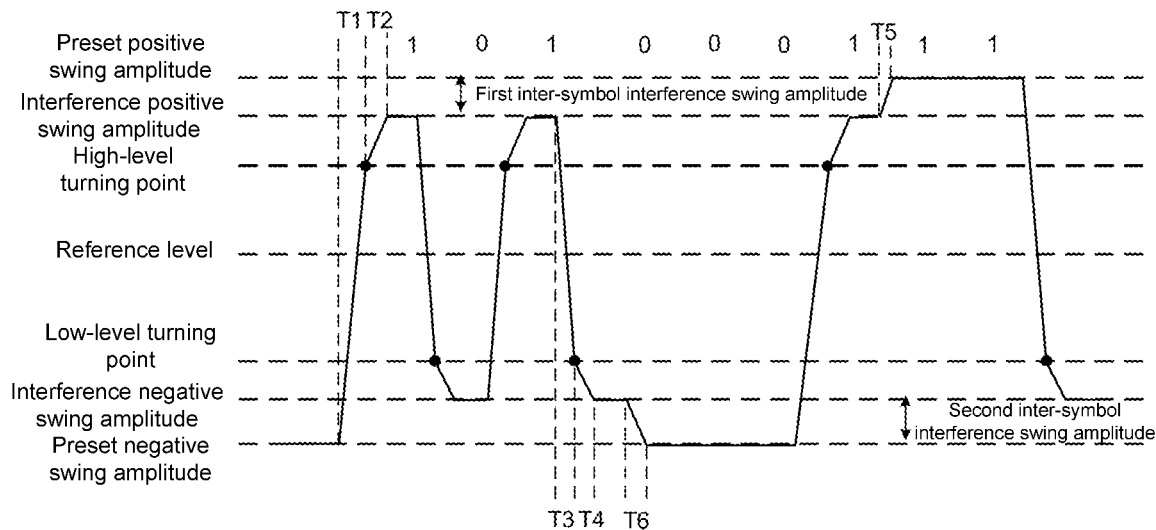
FIG. 6 is a schematic diagram of an amplitude value of an input signal generated based on the second data input verification method according to an embodiment of the present disclosure.
Figure 7:
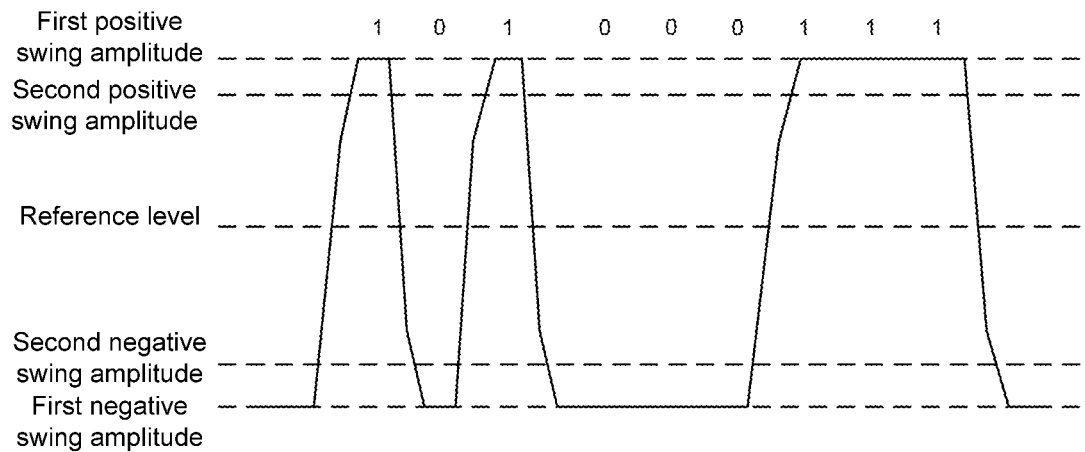
FIG. 7 is a schematic diagram of an amplitude value of an ideal output signal after compensated by a decision feedback equalizer according to an embodiment of the present disclosure.

FIG. 1 is a schematic structural diagram of a data receiving structure of a memory according to this embodiment; FIG. 2 is a schematic diagram of the principle of inter-symbol interference during data receiving of a memory according to this embodiment; FIG. 3 is a schematic flowchart corresponding to steps of a first data input verification method according to this embodiment; FIG. 4 is a schematic diagram of an amplitude value of an input signal generated based on the first data input verification method according to this embodiment; FIG. 5 is a schematic flowchart corresponding to steps of a second data input verification method according to this embodiment; FIG. 6 is a schematic diagram of an amplitude value of an input signal generated based on the second data input verification method according to this embodiment; and FIG. 7 is a schematic diagram of an amplitude value of an ideal output signal after compensated by a decision feedback equalizer according to this embodiment. The data input verification method provided by this embodiment is described in detail below with reference to the accompanying drawings.

Referring to FIG. 3, the data input verification method includes the following steps:

Step 101: Generate a randomly combined input character string.

For example, with the character "0" as a low-level input signal and the character "1" as a high-level input signal, a randomly combined input character string of characters "0" and "1" is generated.

It should be noted that in this embodiment, the input character string "101000111" is used as an example to provide a detailed description of the data input verification method disclosed in this embodiment, which is intended to facilitate those skilled in the art to understand the implementation of the embodiment of the present disclosure and does not limit this embodiment. In other embodiments, the input character string is any randomly character string combined by characters "1" and "0".

Step 102: Generate a test input signal based on the input character string.

For example, a test input signal to the receiver of the memory is generated based on the input character string and a simulated inter-symbol interference value, where the simulated inter-symbol interference value is an estimated value of inter-symbol interference transmitted from an output end of the memory controller to the receiver.

It can be learned from the content of FIG. 2 that the initial input data outputted by the transmitter Controller Tx of the memory controller is N1. The initial input data N1 is subjected to the interference of a time-domain response error during the transmission process in the data transmission channel Channel and becomes input data N2 inputted to the receiver of the memory. Compared with the initial input data N1, in the input data N2, the non-consecutive character "1" corresponds to a swing amplitude decrease $\alpha$, and the non-consecutive character "0" corresponds to a swing amplitude increase $\beta$. Similarly, referring to FIG. 4, in the test input signal generated in step 102, the consecutive non-initial character "1" corresponds to a preset positive swing amplitude, and the non-consecutive character "1" corresponds to an interference positive swing amplitude; the consecutive non-initial character "0" corresponds to a preset negative swing amplitude, and the non-consecutive character "0" corresponds to an interference negative swing amplitude. The value of the preset positive swing amplitude is greater than that of the interference positive swing amplitude, and the value of the preset negative swing amplitude is less than that of the interference negative swing amplitude. It should be noted that the preset negative swing amplitude and the interference negative swing amplitude described in the present disclosure are both negative values. Therefore, a smaller amplitude represents that the signal is subject to less interference and the data can be recognized more effectively. The absolute value of the preset negative swing amplitude is greater than that of the interference negative swing amplitude.

For example, for the input character string "101000111", from left to right, the first character "1" is a non-consecutive character, the second character "0" is a non-consecutive character, the third character "1" is also a non-consecutive character, the fourth character "0" is also a non-consecutive character, the fifth character "0" and the sixth character "0" are both consecutive non-initial characters, the seventh character "1" is a non-consecutive character, and the eighth character "1" and the ninth character "1" are both consecutive non-initial characters.

It should be noted that the reference level in FIG. 4 is obtained based on the eye diagram of the corresponding memory output signal. In one example, the reference level= (the maximum level of the eye diagram+the minimum level of the eye diagram)/2.

For example, the interference positive swing amplitude is generated based on the preset positive swing amplitude and the simulated inter-symbol interference value, while the interference negative swing amplitude is generated based on the preset negative swing amplitude and the simulated inter-symbol interference value.

Step 103: Input the test input signal into a receiver and obtain an output signal of the receiver.

Step 104: Determine whether a character string represented by the output signal is equal to the input character string, and generate an eye diagram of the output signal.

For example, based on the high-level amplitude range and low-level amplitude range recognizable by the memory, the output signal is converted into an output character string, and it is determined whether the output character string is the same as the input character string. The eye diagram of the output signal is generated to obtain the reference level mentioned above and to determine whether the output signal of the receiver meets the signal standards specified by the Joint Electron Device Engineering Council (JEDEC).

If the level of the output signal is within the high-level amplitude range recognizable by the memory, this part of the output signal is converted to the character "1". If the level of the output signal is within the low-level amplitude range recognizable by the memory, this part of the output signal is converted to the character "0". Then, according to the level timing of the output signal, the converted characters "1" and "0" are combined to generate the character string represented by the output signal.

If the character string represented by the output signal is the same as the input character string, it indicates that the receiver is working properly. If the character string represented by the output signal is different from the input character string, it indicates that the receiver is not working properly.

A test input signal is generated by combining an input character string with a simulated inter-symbol interference value, to simulate input data received by a receiver after being affected by inter-symbol interference, so as to simulate the actual working state of the receiver. A character string converted from output data of the receiver is obtained, so as to obtain an output signal generated by the receiver based on the input data affected by the inter-symbol interference. The working state of the receiver is determined based on the input character string and the obtained output signal, to test the performance of the receiver in the memory. The performance of the receiver is tested at a lower cost, thereby avoiding the effect of time-domain response errors on the data inputted into the memory.

It should be noted that in some embodiments, the interference positive swing amplitude and the interference negative swing amplitude are generated based on a same simulated inter-symbol interference value; in some embodiments, the interference positive swing amplitude and the interference negative swing amplitude can be generated based on different simulated inter-symbol interference values.

Referring to FIG. 6, the interference positive swing amplitude is generated based on a first inter-symbol interference swing amplitude, and the interference negative swing amplitude is generated based on a second inter-symbol interference swing amplitude. An absolute value of the interference negative swing amplitude=an absolute value of the preset negative swing amplitude−the second inter-symbol interference swing amplitude. The first inter-symbol interference swing amplitude and the second inter-symbol interference swing amplitude are obtained based on the simulated inter-symbol interference value of the corresponding receiver. That is, the first inter-symbol interference swing amplitude and the second inter-symbol interference swing amplitude are generated based on a swing diagram of transmission data between the corresponding memory and memory controller (see FIG. 2), or set based on actual testing needs. Then, the corresponding interference positive swing amplitude and the corresponding interference negative swing amplitude are generated based on the first inter-symbol interference swing amplitude and the second inter-symbol interference swing amplitude, to simulate the swing amplitude effect of the inter-symbol interference on the actual input signal received by the receiver.

Referring to FIG. 5, in some embodiments, before generating the input signal, the method further includes: adjusting the first inter-symbol interference swing amplitude and the second inter-symbol interference swing amplitude based on the simulated inter-symbol interference value. That is, between step 101 and step 102, the method further includes step 201: setting and adjusting the first inter-symbol interference swing amplitude and the second inter-symbol interference swing amplitude, and generate the interference positive swing amplitude and the interference negative swing amplitude. The interference positive swing amplitude and the interference negative swing amplitude generated based on the first inter-symbol interference swing amplitude and the second inter-symbol interference swing amplitude are more in line with the level of the actual input signal received by the receiver, thereby improving the accuracy of the receiver verification.

For step 102, referring to FIG. 6, in some embodiments, generating the test input signal based on the input character string includes: generating the test input signal based on a first change time T1, a second change time T2, a third change time T3, a fourth change time T4, a fifth change time T5, and a sixth change time T6. The first change time T1 is a period of time during which a signal level rises from a level of an adjacent preceding low-level input signal to a level at a high-level turning point, and an amplitude of the low-level input signal is the interference negative swing amplitude or the preset negative swing amplitude. The second change time T2 is a period of time during which the signal level changes from the level at the high-level turning point to the interference positive swing amplitude. The third change time T3 is a period of time during which the signal level drops from a level of an adjacent preceding high-level input signal to a level at a low-level turning point, and an amplitude of the high-level input signal is the interference positive swing amplitude or the preset positive swing amplitude. The fourth change time T4 is a period of time during which the signal level changes from the level at the low-level turning point to the interference negative swing amplitude. The fifth change time T5 is a period of time during which the signal level changes from the interference positive swing amplitude to the preset positive swing amplitude. The sixth change time T6 is a period of time during which the signal level changes from the interference negative swing amplitude to the preset negative swing amplitude. The test input signal is adjusted by using the first change time, the second change time, the third change time, the fourth change time, the fifth change time, and the sixth change time, to further adjust the generated test input signal, such that the test input signal received by the receiver is more in line with the actual situation, thereby improving the accuracy of the receiver verification. In addition, the generated test input signal is fine-tuned to ensure that the output signal of the receiver meets the eye diagram standard specified by the JEDEC.

Correspondingly, referring to FIG. 5, between the step 101 and the step 102, i.e., before generating the input signal, the method further includes step 202: setting and adjusting the first change time T1, the second change time T2, the third change time T3, the fourth change time T4, the fifth change time T5, and the sixth change time T6.

In one example, the first change time T1 is greater than the second change time T2, the second change time T2 is the same as the fifth change time T5, the third change time T3 is greater than the fourth change time T4, and the fourth change time T4 is the same as the sixth change time T6. In another example, the first change time T1 is the same as the second change time T2, the second change time T2 is greater than the fifth change time T5, the third change time T3 is the same as the fourth change time T4, and the fourth change time T4 is greater than the sixth change time T6. In yet another example, the first change time T1, the second change time T2, and the fifth change time T5 are the same, and the third change time T3, the fourth change time T4, and the sixth change time T6 are the same. It should be noted that the settings of the first change time T1, the second change time T2, the third change time T3, the fourth change time T4, the fifth change time T5, and the sixth change time T6 above are only used as examples and do not constitute limitations on this embodiment. In specific applications, specific settings can be made according to the eye diagram standard that needs to be met.

It should also be noted that in the example shown in FIG. 5, in the step 201 and the step 202 between the step 101 and the step 102, the step 201 is executed before the step 202. In other embodiments, the step 202 can be implemented before the step 201, or the step 201 and the step 202 can be implemented simultaneously.

For step 103, in some embodiments, after inputting the test input signal into the receiver and before obtaining the output signal of the receiver, the method further includes: determining to turn on or turn off a decision feedback equalizer (DFE) in the receiver based on a control signal.

The decision feedback equalizer is used to compensate for the amplitude of the input data to the receiver. For example, the decision feedback equalizer is used to pull up the swing amplitude corresponding to non-consecutive character "1" and pull down the swing amplitude corresponding to non-consecutive character "0". By compensating for the amplitude of the input signal affected by inter-symbol interference, the effect of the inter-symbol interference on the input data to the receiver can be avoided and the accuracy of the output data can be ensured. Referring to FIG. 7, FIG. 7 shows the amplitude of the input signal received by the receiver after compensation by the decision feedback equalizer under ideal conditions. The amplitude corresponding to the non-consecutive character "1" and the amplitude corresponding to the consecutive non-initial character "1" are the same, and the amplitude corresponding to the non-consecutive character "0" and the amplitude corresponding to the consecutive non-initial character "0" are the same. That is, with the compensation by the decision feedback equalizer, the effect of the inter-symbol interference on the amplitude of the input data received by the receiver is partially or even entirely eliminated. The decision feedback equalizer is turned on or off based on the control signal, to separately test the output status of the receiver after the decision feedback equalizer is turned on and the output status of the receiver after the decision feedback equalizer is turned off, so as to further test whether the receiver in the memory is working properly.

In some embodiments, if the decision feedback equalizer is turned on, a feedback adjustment weight of the decision feedback equalizer is adjusted based on an adjustment signal. The feedback adjustment weight of the decision feedback equalizer is adjusted, that is, an amplitude adjustment provided by the decision feedback equalizer for the input signal received by the receiver is adjusted, to further test whether the receiver in the memory is working properly under the effect of the decision feedback equalizer with different feedback adjustment weights.

A test input signal is generated by combining an input character string with a simulated inter-symbol interference value, to simulate input data received by a receiver after being affected by inter-symbol interference, so as to simulate the actual working state of the receiver. A character string converted from output data of the receiver is obtained, so as to obtain an output signal generated by the receiver based on the input data affected by the inter-symbol interference. The working state of the receiver is determined based on the input character string and the obtained output signal, to test the performance of the receiver in the memory. The performance of the receiver is tested at a lower cost, thereby avoiding the effect of time-domain response errors on the data inputted to the memory.

It should be noted that, features disclosed in the data input verification method provided in the foregoing embodiment can be arbitrarily combined without conflict, and a new data input verification method embodiment can be obtained.

Another embodiment of the present disclosure provides a data input verification structure, which performs verification based on the data input verification method provided by the foregoing embodiment, thereby avoiding the effect of time-domain response errors on the data input of the memory.

Figure 8:
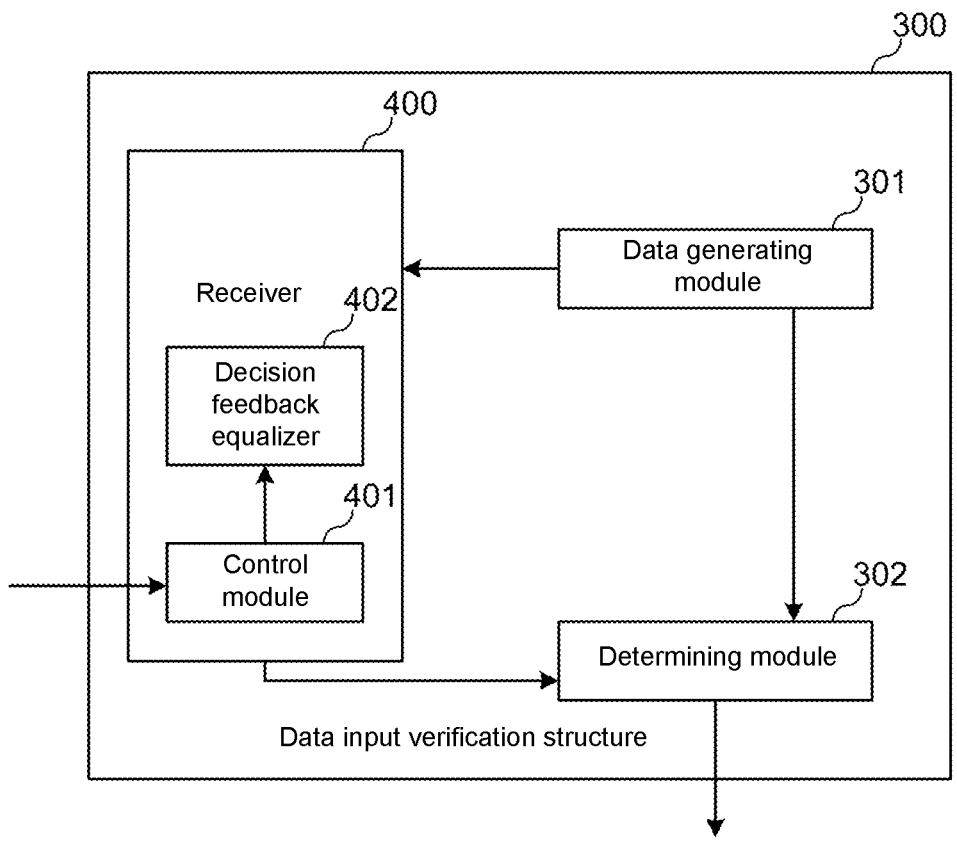
FIG. 8 is a schematic structural diagram of a data input verification structure according to another embodiment of the present disclosure.
Figure 9:
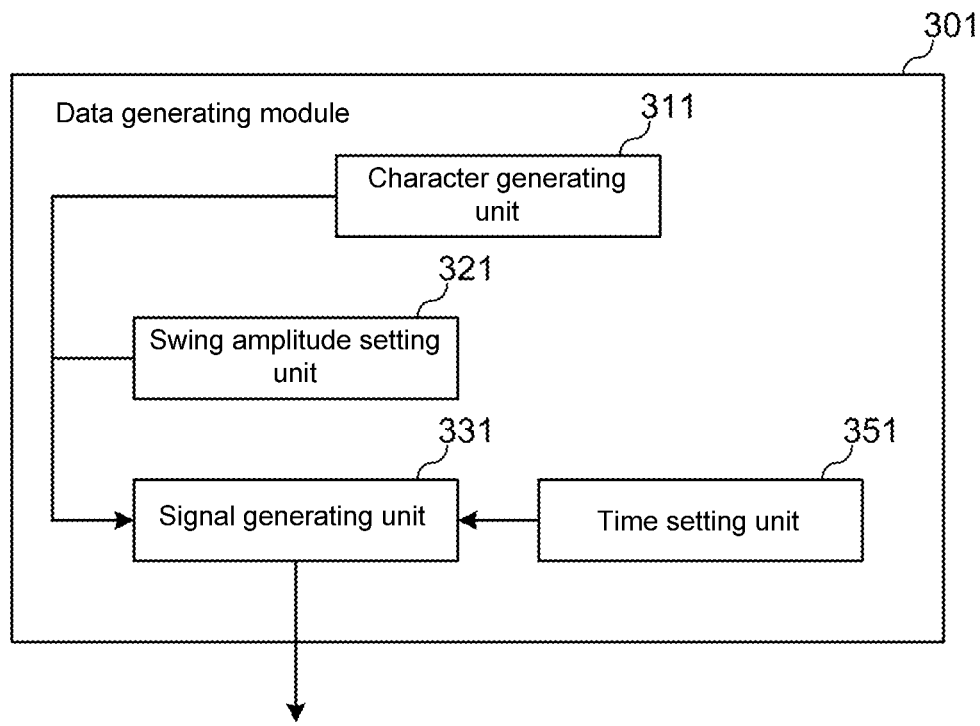
FIG. 9 is a structural schematic diagram of a data generating module according to another embodiment of the present disclosure.

FIG. 8 is a schematic structural diagram of a data input verification structure according to this embodiment. FIG. 9 is a schematic structural diagram of a data generating module provided by this embodiment. The data input verification structure provided in this embodiment is described in detail below with reference to the accompanying drawings, and content the same as that in the foregoing embodiment will not be described again in this embodiment. Details are as follows:

Referring to FIG. 8, the data input verification structure 300 includes:

a data generating module 301 configured to generate a randomly combined input character string, and generate a test input signal inputted to a receiver 400 of a memory based on the input character string and a simulated inter-symbol interference value, where the simulated inter-symbol interference value is an estimated value of inter-symbol interference transmitted from an output end of the memory controller to the receiver 400;

the receiver 400 configured to receive the test input signal and generate an output signal according to the test input signal; and a determining module 302 connected to the data generating module 301 and receiving the output signal, and configured to determine whether a character string represented by the output signal is equal to the input character string and generate an eye diagram of the output signal.

The data generating module generates a randomly combined input character string of characters "0" and "1", with the character "0" as a low-level input signal and the character "1" as a high-level input signal.

In an example, referring to FIG. 9, the data generating module 301 includes: a character generating unit 311 configured to generate a randomly combined input character string; a swing amplitude setting unit 321 configured to store a preset positive swing amplitude, a preset negative swing amplitude, a first inter-symbol interference swing amplitude, and a second inter-symbol interference swing amplitude, where the preset positive swing amplitude and the first inter-symbol interference swing amplitude are used to generate an interference positive swing amplitude, and the preset negative swing amplitude and the first inter-symbol interference swing amplitude are used to generate an interference negative swing amplitude; and a signal generating unit 331 connected to the character generating unit 311 and the swing amplitude setting unit 321, and configured to generate the test input signal based on the preset positive swing amplitude, the interference positive swing amplitude, the preset negative swing amplitude, the interference negative swing amplitude, and the input character string.

For the swing amplitude setting unit 321, the generated interference positive swing amplitude=the preset positive swing amplitude–the first inter-symbol interference swing amplitude, and an absolute value of the interference negative swing amplitude=an absolute value of the preset negative swing amplitude–the second inter-symbol interference swing amplitude. Furthermore, the first inter-symbol interference swing amplitude and the second inter-symbol interference swing amplitude are obtained based on the simulated inter-symbol interference value of the corresponding receiver 400. That is, the first inter-symbol interference swing amplitude and the second inter-symbol interference swing amplitude are generated according to a swing diagram of transmission data between the corresponding memory and memory controller (see FIG. 2). Then, the interference positive swing amplitude and the interference negative swing amplitude are generated based on the first inter-symbol interference swing amplitude and the second inter-symbol interference swing amplitude, to simulate the swing amplitude effect of the inter-symbol interference on the actual input signal received by the receiver 400.

In some embodiments, the swing amplitude setting unit 321 is further configured to adjust a value of the first inter-symbol interference swing amplitude and a value of the second inter-symbol interference swing amplitude, or adjust a ratio of the first inter-symbol interference swing amplitude to the preset positive swing amplitude and a ratio of the second inter-symbol interference swing amplitude to an absolute value of the preset negative swing amplitude. The interference positive swing amplitude and the interference negative swing amplitude generated based on the first inter-symbol interference swing amplitude and the second inter-symbol interference swing amplitude is more in line with the level of the actual input signal received by the receiver 400, thereby improving the accuracy of the verification for the receiver 400.

Further referring to FIG. 9, in some embodiments, the data generating module 301 further includes: a time setting unit 351 configured to store the first change time, the second change time, the third change time, the fourth change time, the fifth change time, and the sixth change time; and the signal generating unit 331 is configured to generate the test input signal based on the first change time, the second change time, the third change time, the fourth change time, the fifth change time, and the sixth change time. The first change time T1 is a period of time during which a signal level rises from a level of an adjacent preceding low-level input signal to a level at a high-level turning point, and an amplitude of the low-level input signal is the interference negative swing amplitude or the preset negative swing amplitude. The second change time T2 is a period of time during which the signal changes from the level at the high-level turning point to the interference positive swing amplitude. The third change time T3 is a period of time during which the signal level drops from a level of an adjacent preceding high-level input signal to a level at a low-level turning point, and an amplitude of the high-level input signal is the interference positive swing amplitude or the preset positive swing amplitude. The fourth change time T4 is a period of time during which the signal level changes from the level at the low-level turning point to the interference negative swing amplitude. The fifth change time T5 is a period of time during which the signal level changes from the interference positive swing amplitude to the preset positive swing amplitude. The sixth change time T6 is a period of time during which the signal level changes from the interference negative swing amplitude to the preset negative swing amplitude. The test input signal is adjusted by using the first change time, the second change time, the third change time, the fourth change time, the fifth change time, and the sixth change time, to further adjust the generated test input signal, such that the test input signal received by the receiver 400 is more in line with the actual situation, thereby improving the accuracy of the verification for the receiver 400. In addition, the generated test input signal is fine-tuned to ensure that the output signal of the receiver 400 meets the eye diagram standard specified by the JEDEC.

In some embodiments, the time setting unit 351 is further configured to adjust the first change time, the second change time T2, the third change time, the fourth change time, the fifth change time, and the sixth change time.

Referring to FIG. 8, in some embodiments, the receiver 400 includes: a decision feedback equalizer 402 configured to pull up a swing amplitude of a sub-signal corresponding to the non-consecutive character "1" and pull down a swing amplitude of a sub-signal corresponding to the non-consecutive character "0"; and a control module 401 configured to generate a control signal and an adjustment signal based on external instructions, where the control signal is used to control the decision feedback equalizer 402 to be turned on or turned off, and the adjustment signal is used to adjust a feedback adjustment weight of the decision feedback equalizer 402. The decision feedback equalizer 402 is turned on or off based on the control signal, to separately test the output status of the receiver 400 after the decision feedback equalizer 402 is turned on and the output status of the receiver 400 after the decision feedback equalizer 402 is turned off, so as to further test whether the receiver 400 in the memory is working properly. The feedback adjustment weight of the decision feedback equalizer 402 is adjusted, that is, an amplitude adjustment provided by the decision feedback equalizer 402 for the input signal received by the receiver 400 is adjusted, to further test whether the receiver 400 in the memory is working properly under the effect of the decision feedback equalizer with different feedback adjustment weights.

The determining module 302 is configured to convert the output signal into an output character string based on a high-level amplitude range and a low-level amplitude range recognizable by the memory, determine whether the output character string is the same as the input character string, generate the eye diagram of the output signal to obtain the reference level mentioned above, and determine whether the output signal of the receiver 400 meets the signal standards specified by the JEDEC.

For example, if the level of the output signal is within the high-level amplitude range recognizable by the memory, this part of the output signal is converted into the character "1"; if the level of the output signal is within the low-level amplitude range recognizable by the memory, this part of the output signal is converted into the character "0". Then, based on the level timing of the output signal, the converted characters "1" and "0" are combined to generate the character string represented by the output signal.

If the character string represented by the output signal is the same as the input character string, it indicates that the receiver 400 is working properly. If the character string represented by the output signal is different from the input character string, it indicates that the receiver 400 is not working properly.

Each unit involved in this embodiment is a logical unit. During actual application, a logical unit may be a physical unit, or may be a part of a physical unit, or may be implemented as a combination of a plurality of physical units. In addition, in order to highlight the innovative part of the present disclosure, units that are not closely related to resolving the technical problem proposed by the present disclosure are not introduced in this embodiment, but this does not indicate that there are no other units in this embodiment.

It is to be noted that features disclosed in the data input verification structure in the above embodiment may be combined freely without conflicts to obtain a new embodiment of the data input verification structure.

The embodiments or implementations of this specification are described in a progressive manner, and each embodiment focuses on differences from other embodiments. The same or similar parts between the embodiments may refer to each other.

In the description of this specification, the description referring to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail referring to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the data input verification method and data input verification structure provided by the embodiments of the present disclosure, a test input signal is generated by combining an input character string with a simulated inter-symbol interference value, to simulate input data received by a receiver after being affected by inter-symbol interference, so as to simulate the actual working state of the receiver. A character string converted from output data of the receiver is obtained, so as to obtain an output signal generated by the receiver based on the input data affected by inter-symbol interference. The working state of the receiver is determined based on the input character string and the obtained output signal, to test the performance of the receiver in the memory. The performance of the receiver is tested at a lower cost, thereby avoiding the effect of time-domain response errors on the data input of the memory.

The invention claimed is:

1. A data input verification method, comprising:
generating a randomly combined input character string;
generating a test input signal inputted to a receiver of a memory based on the input character string and a simulated inter-symbol interference value, wherein the simulated inter-symbol interference value is an estimated value of inter-symbol interference transmitted from an output end of a memory controller to the receiver;

inputting the test input signal into the receiver and obtaining an output signal of the receiver; and determining whether a character string represented by the output signal is equal to the input character string, and generating an eye diagram of the output signal;

wherein, in generated test input signal, a consecutive non-initial character "1" corresponds to a preset positive swing amplitude, a non-consecutive character "1" corresponds to an interference positive swing amplitude, a consecutive non-initial character "0" corresponds to a preset negative swing amplitude, and a non-consecutive character "0" corresponds to an interference negative swing amplitude; a value of the preset positive swing amplitude is greater than a value of the interference positive swing amplitude, and a value of the preset negative swing amplitude is less than a value of the interference negative swing amplitude.

2. The data input verification method according to claim 1, wherein the determining whether a character string represented by the output signal is equal to the input character string comprises:

converting the output signal into an output character string based on a high-level amplitude range and a low-level amplitude range recognizable by the memory; and determining whether the output character string is the same as the input character string.

3. The data input verification method according to claim 1, wherein the interference positive swing amplitude=the preset positive swing amplitude−a first inter-symbol interference swing amplitude; and an absolute value of the interference negative swing amplitude=an absolute value of the preset negative swing amplitude−a second inter-symbol interference swing amplitude.

4. The data input verification method according to claim 3, wherein before generating the test input signal, the method further comprises: adjusting and setting the first inter-symbol interference swing amplitude and the second inter-symbol interference swing amplitude based on the simulated inter-symbol interference value.

5. The data input verification method according to claim 1, wherein the generating the test input signal based on the input character string comprises: generating the test input signal based on a first change time, a second change time, a third change time, a fourth change time, a fifth change time, and a sixth change time;

the first change time is a period of time during which a signal level rises from an a level of adjacent preceding low-level input signal to a level at a high-level turning point, and an amplitude of the low-level input signal is the interference negative swing amplitude or the preset negative swing amplitude;

the second change time is a period of time during which the signal changes from the level at the high-level turning point to the interference positive swing amplitude;

the third change time is a period of time during which the signal level drops from a level of an adjacent preceding high-level input signal to a level at a low-level turning point, and an amplitude of the high-level input signal is the interference positive swing amplitude or the preset positive swing amplitude;

the fourth change time is a period of time during which the signal level changes from the level at the low-level turning point to the interference negative swing amplitude;

the fifth change time is a period of time during which the signal level changes from the interference positive swing amplitude to the preset positive swing amplitude; and the sixth change time is a period of time during which the signal level changes from the interference negative swing amplitude to the preset negative swing amplitude.

6. The data input verification method according to claim 5, wherein before generating the test input signal, the method further comprises: setting and adjusting the first change time, the second change time, the third change time, the fourth change time, the fifth change time, and the sixth change time.

7. The data input verification method according to claim 1, wherein after inputting the test input signal into the receiver and before obtaining the output signal of the receiver, the method further comprises: determining to turn on or turn off a decision feedback equalizer in the receiver based on a control signal.

8. The data input verification method according to claim 7, wherein responding to the decision feedback equalizer being turned on, a feedback adjustment weight of the decision feedback equalizer is further adjusted based on an adjustment signal.

9. A data input verification structure, performing input verification by using the data input verification method according to any one of claim 1, comprising:

a data generating module, configured to generate a randomly combined input character string, and generate a test input signal inputted to a receiver of a memory based on the input character string and a simulated inter-symbol interference value, wherein the simulated inter-symbol interference value is an estimated value of inter-symbol interference transmitted from an output end of a memory controller to the receiver;

the receiver, configured to receive the test input signal and generate an output signal according to the test input signal; and a determining module, connected to the data generating module and receiving the output signal, and configured to determine whether a character string represented by the output signal is equal to the input character string and generate an eye diagram of the output signal.

10. The data input verification structure according to claim 9, wherein the data generating module comprises:

a character generating unit, configured to generate the randomly combined input character string;

a swing amplitude setting unit, configured to store a preset positive swing amplitude, a preset negative swing amplitude, a first inter-symbol interference swing amplitude, and a second inter-symbol interference swing amplitude, wherein the preset positive swing amplitude and the first inter-symbol interference swing amplitude are used to generate an interference positive swing amplitude, and the preset negative swing amplitude and the second inter-symbol interference swing amplitude are used to generate an interference negative swing amplitude; and a signal generating unit, connected to the character generating unit and the swing amplitude setting unit, and configured to generate the test input signal based on the preset positive swing amplitude, the interference positive swing amplitude, the preset negative swing amplitude, the interference negative swing amplitude, and the input character string.

11. The data input verification structure according to claim 10, wherein the swing amplitude setting unit is further configured to adjust a value of the first inter-symbol interference swing amplitude and a value of the second inter-symbol interference swing amplitude, or to adjust a ratio of the first inter-symbol interference swing amplitude to the preset positive swing amplitude and a ratio of the second inter-symbol interference swing amplitude to an absolute value of the preset negative swing amplitude.

12. The data input verification structure according to claim 10, further comprising:
   a time setting unit, configured to store a first change time, a second change time, a third change time, a fourth change time, a fifth change time, and a sixth change time;
   wherein the signal generating unit is configured to generate the test input signal based on the first change time, the second change time, the third change time, the fourth change time, the fifth change time, and the sixth change time.

13. The data input verification structure according to claim 12, wherein the time setting unit is further configured to adjust the first change time, the second change time, the third change time, the fourth change time, the fifth change time, and the sixth change time.

14. The data input verification structure according to claim 9, wherein the receiver comprises:
   a decision feedback equalizer configured to pull up a swing amplitude of a sub-signal corresponding to a non-consecutive character "1" and pull down a swing amplitude of a sub-signal corresponding to a non-consecutive character "0"; and
   a control module configured to generate a control signal and an adjustment signal based on external instructions;
   wherein the control signal is used to control the decision feedback equalizer to be turned on or turned off, and the adjustment signal is used to adjust a feedback adjustment weight of the decision feedback equalizer.

* * * * *